United States Patent [19]
Tsutsui

[11] Patent Number: 6,148,424
[45] Date of Patent: Nov. 14, 2000

[54] PATTERN GENERATING APPARATUS

[75] Inventor: Yasumitsu Tsutsui, Tokyo, Japan

[73] Assignee: Ando Electric Co., Ltd., Tokyo, Japan

[21] Appl. No.: 09/082,785

[22] Filed: May 21, 1998

[30] Foreign Application Priority Data

May 23, 1997 [JP] Japan ................................ 9-134143

[51] Int. Cl.[7] .................................................. G11C 29/00
[52] U.S. Cl. ........................................................ 714/720
[58] Field of Search ................................... 714/718, 720, 714/738, 739; 365/200, 201

[56] References Cited

U.S. PATENT DOCUMENTS

| | | | |
|---|---|---|---|
| 4,300,234 | 11/1981 | Maruyama et al. | 714/718 |
| 4,402,081 | 8/1983 | Ichimiya et al. | 714/718 |
| 4,759,021 | 7/1988 | Kawaguchi et al. | 714/738 |
| 5,265,102 | 11/1993 | Saito | 714/738 |
| 5,473,616 | 12/1995 | Tsutsui et al. | 714/712 |
| 5,615,218 | 3/1997 | Tsurumi | 714/743 |
| 5,856,985 | 1/1999 | Fujisaki | 714/738 |
| 5,883,905 | 3/1999 | Eastburn | 714/738 |
| 5,970,073 | 10/1999 | Masuda et al. | 714/738 |

FOREIGN PATENT DOCUMENTS 62-185177  8/1987  Japan .

*Primary Examiner*—Albert De Cady
*Assistant Examiner*—Shelly A Chase
*Attorney, Agent, or Firm*—Fish & Richardson P.C.

[57] ABSTRACT

A pattern generating apparatus used in quality judgment testing of memories incorporating a predetermined signal transfer configuration such as a protocol transfer system, the apparatus having: an address generating device for sequentially generating address patterns for specifying storage regions in a test memory; a first control device for converting the sequentially generated address patterns into a signal transfer configuration for the test memory and supplying these to the test memory to sequentially access the storage regions specified by the respective address patterns; and a second control device for determining a condition in which the test memory is operated with respect to the address pattern generated by the address generating device, and controlling a generation timing for the address pattern based on this.

16 Claims, 2 Drawing Sheets

```
START: (X, Y) = (4, 0) ------ (1) ⎤
       (X, Y) = (4, 1)             ⎥ FIRST TRANSACTION
       (X, Y) = (4, 2)             ⎥
  END: (X, Y) = (4, 3) ------ (2) ⎦
START: (X, Y) = (4, 4) ------ (3) ⎤
       (X, Y) = (4, 5)             ⎥ SECOND TRANSACTION
       (X, Y) = (4, 6)             ⎥
  END: (X, Y) = (4, 7) ------ (4) ⎦
       :
       :
```

PATTERN GENERATING APPARATUS

BACKGROUND OF THE INVENTION

1. Field of the Invention

The present invention relates to a pattern generating apparatus used for quality judgment testing of memories incorporating a predetermined signal transfer configuration such as a protocol transmission system. The present application is based on a patent application in Japan (Japanese Patent Application No. Hei 9-134143(1997)), and the contents of this Japanese application are incorporated herein as part of the present specification.

2. Description of the Related Art

Recently, with the speeding up of micro-processors, in order to realize a high speed system, a device incorporating a protocol transmission system which is capable of high band width data transmission has been developed by providing a special circuit in an interface section of a memory in a semiconductor memory. With this, it has become necessary to appropriately carry out quality judgment testing of the semiconductor memory. In quality judgement testing of a memory incorporating such a protocol transmission system, normally an address pattern is generated in accordance with a program of a previously created pass/fail judgement test pattern, and the pass/fail judgement test is carried out by converting this to a signal configuration for accessing the storage region of the memory to be tested (referred to hereunder as the test memory), to thereby access a predetermined memory region of the test memory.

Here with the program for the pass/fail judgment test pattern, in order to ensure access to the test memory by the generated respective test patterns, it is necessary to generate the address patterns while appropriately considering the operating conditions of the test memory. Due to this situation, then with the quality judgement test for a memory incorporating a protocol transmission system, since the programmer must previously assume the condition of the test memory at the time of operation and create the program for the test pattern based on this while considering the influence due to the protocol transmission, program creation is complicated.

Therefore, in order to avoid such difficulties with the program creation, it is desirable to carry out program creation considering only access to a desired memory region without considering the influence due to the signal transfer configuration for the test memory.

SUMMARY OF THE INVENTION

The present invention takes into consideration this situation, with the object of providing a pattern generating apparatus wherein it is possible to create a program for a test pattern considering only access to a storage region of a memory incorporating a predetermined signal transfer configuration such as a protocol transmission system, so that program creation for a memory quality judgement test can be simplified.

The present invention is characterized in comprising: an address generating device for sequentially generating address patterns for specifying storage regions in a test memory; a first control device for converting the sequentially generated address patterns into a signal transfer configuration for the test memory and supplying these to the test memory to sequentially access the storage regions specified by the respective address patterns; and a second control device for determining a condition in which the test memory is operated with respect to the address pattern generated by the address generating device, and controlling a generation timing for the address pattern based on the determined condition.

Consequently, with the present invention, there is provided a second control device for determining a condition in which the test memory is operated with respect to the address pattern generated by the address generating device, and controlling a generation timing for the address pattern based on this. Therefore, if only the address pattern to be generated is decided, then it is possible to eliminate any mismatch between the operational timing of the address generating means and the test memory by converting the address pattern and accessing the converted address pattern and thus access the desired storage region. As a result, it is possible to create a program for a test pattern considering only access to a storage region of a memory incorporating a pre-determined signal transfer configuration such as a protocol transmission system, thus enabling the creation of programs for quality judgement tests of memories to be simplified.

DESCRIPTION OF THE PREFERRED EMBODIMENT

As follows is a description of an embodiment of the present invention, with reference to the drawings. At first, before describing the pattern generating apparatus according to the present invention, an outline is given of a pattern generating apparatus based on which the pattern generating apparatus of the invention is applied, and which is operated by a test pattern program created taking into consideration the influence due to the signal transfer configuration for the test memory.

Figure 3:
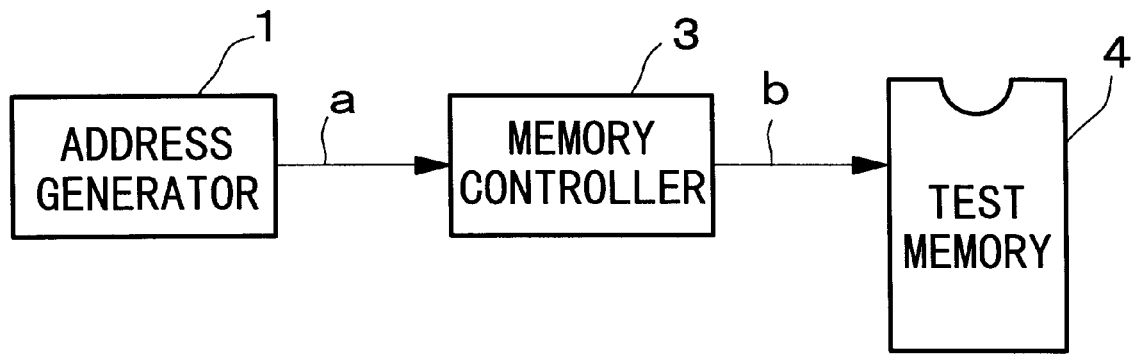
FIG. 3 is a block diagram illustrating the construction of a pattern generating apparatus for testing a semiconductor memory incorporating a protocol transmission system, on the basis of this apparatus, the pattern generating apparatus according to the embodiment of the present invention is applied.

FIG. 3 is a block diagram of a pattern generating apparatus for testing a semiconductor memory incorporating a protocol transmission system, showing the construction of a test pattern generating apparatus based on which the pattern generating apparatus according to the embodiment of the present invention is applied. In FIG. 3, numeral 1 denotes an address generator, 3 denotes a memory controller, and 4 denotes a test memory.

The address generator 1 generates several patterns for an address pattern "a" comprising a row address and a column address, for each execution of one transaction, and outputs these to the memory controller 3.

The memory controller 3 converts the received address pattern "a" into a test pattern corresponding to a protocol transmission system for the test memory 4, and after carrying out necessary timing adjustment outputs this to the test memory 4 as a request packet "b". Here with the request packet "b", the format of the packet is determined by the test memory, and if the data is not transmitted according to this format, the address pattern cannot be accurately verified on the memory side.

The test memory 4 is a semiconductor memory which is the object of the pass/fail judgement test. This memory is one where it is possible to decode a row address and column address from the received request packet "b" to thereby access one memory cell specified thereby.

In this way, when accessing a memory cell inside the memory incorporating the protocol transmission system, it is necessary to temporarily create a request packet from the address pattern and give this to the test memory.

Next is a description of the operation for the above construction taking as an example the case where there is continuous access to the memory by repeating a transaction which sequentially specifies four column addresses inside the same row address.

Here if the row address and column address are respectively "X" and "Y", and a program description for specifying the address of the memory by means of these is for example "(X, Y)=(4, 3)", then this accesses the memory cell of row address 4 and column address 3. A test pattern as shown in FIG. 4 is then created by such a program description, and the apparatus is operated according to this.

Figure 4:
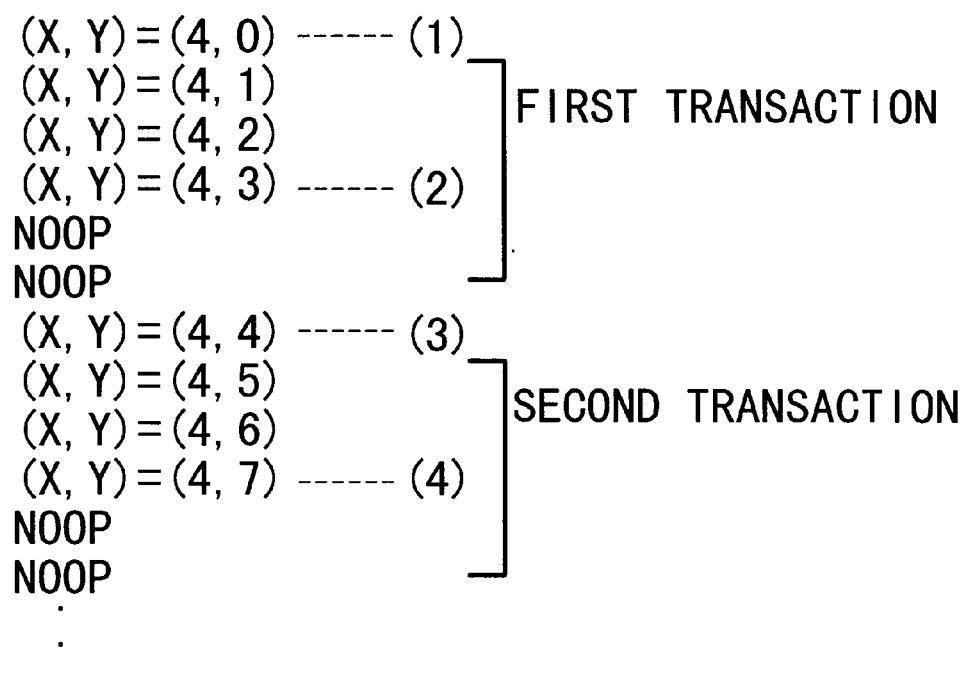
FIG. 4 is a diagram illustrating a program example for a test pattern in the pattern generating apparatus of FIG. 3.

At first, the address generator 1 sequentially generates an address test pattern "a" of "(X, Y)=(4, 0), (4, 1), (4, 2), (4, 3)" in accordance with the row addresses and column addresses sequentially specified during the interval from (1) to (2) in FIG. 4, and supplies this to the memory controller 3.

The memory controller 3 then receives the address pattern "a", converts this to a data pattern corresponding to the protocol transmission system of the test memory 4, and after carrying out necessary timing adjustment, creates a request packet "b" and outputs this to the test memory 4.

In this way, with the test memory 4, at first the row address and column address are decoded from the sequentially received request packet "b", and one memory cell which is specified by means of these is accessed.

Here with the program of FIG. 4, the description is such that after generating the address pattern during the interval from (1) to (2), a timing pattern "(X, Y)=(NOOP, NOOP)" is generated. This is necessary for adjusting any time difference between the time required for the test memory 4 to complete one transaction, and the time required for the address generator 1 to generate all of the address patterns within one transaction, and for coordinating the timing. The programmer previously describes this so that there is a suitable time adjustment for the operating conditions of the test memory 4.

In FIG. 4, the case is assumed where when the time required for the address generator 1 to generate one address pattern is made one cycle, the address generator 1 generates four address patterns in one transaction, while the test memory 4 requires a time of six cycles to complete this transaction. In order to adjust this time difference, a timing pattern for the two cycle portion is generated. Consequently the address generator 1, after generating the address pattern during the interval from (1) to (2) as mentioned above, generates the timing pattern "(X, Y)=(NOOP, NOOP)" twice. Furthermore, the memory controller 3 does not output a request packet "b" when these timing patterns are received.

Following this, the address generator 1 sequentially generates an address pattern "(X, Y)=(4, 4), (4, 5), (4, 6), (4, 7)" during the interval from (3) to (4), being the next transaction, and as a result, the memory controller 3 sequentially outputs the request packet "b" as described above, so that the memory cells of the test memory 4 are sequentially accessed. After this, the address generator 1 again generates the timing pattern ""(X, Y)=(NOOP, NOOP)" twice as described above.

By repeating the above operation, the memory is sequentially accessed to thereby effect pass/fail judgement testing of the test memory 4.

When pass/fail judgement testing of the memory incorporating the protocol transmission system is carried out as described above, the test pattern for pass/fail judgement is used. However in creating this test pattern, it is necessary that the address pattern is generated while appropriately considering the operating condition of the memory being tested. That is to say, this must be such that the address pattern "a" is output from the address generator 1 so that the transmission timing and phase of the request packet "b" sent to the test memory 4 are coordinated for each respective transaction.

Due to this requirement, with the pattern generating apparatus of FIG. 3, so that there is a description such that the program of FIG. 4 generates a dummy pattern "(X, Y)=(NOOP, NOOP)", the programmer makes an assumption in advance regarding a condition for the test memory at the time of operation and creates the test pattern program, while considering the influence due to protocol transmission based on this assumption. However, such program creation is difficult.

With the pattern generating apparatus according to the present invention, by means of the following construction and operation, the difficulty with such program creation is overcome, program creation being easily carried out taking into consideration only access to the desired storage region without considering the influence due to the signal transfer configuration for the test memory.

Figures 1, 2:
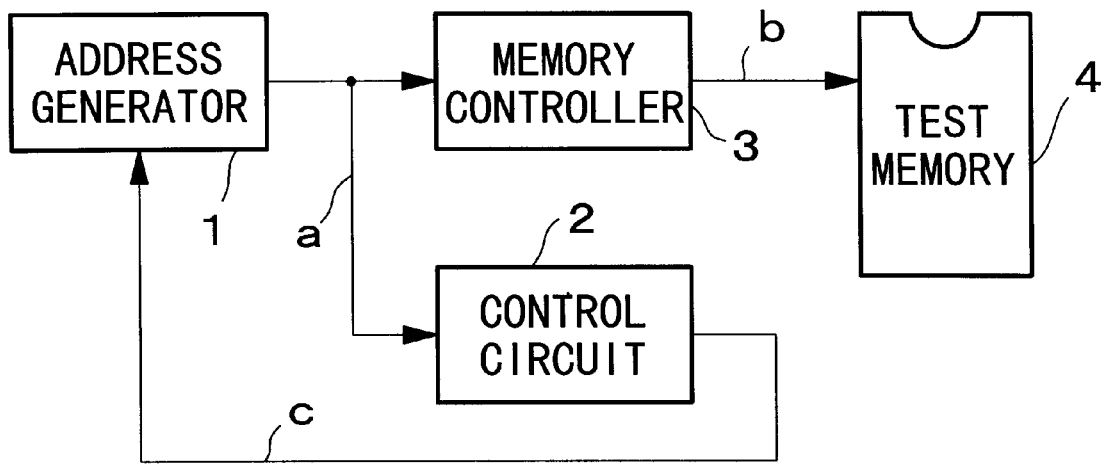
FIG. 1 is a block diagram illustrating a construction of a pattern generating apparatus according to an embodiment of the present invention.
FIG. 2 is a diagram illustrating a program example for a test pattern in the pattern generating apparatus of FIG. 1.

FIG. 1 is a block diagram illustrating a construction of a pattern generating apparatus according to the embodiment of the present invention. The pattern generating apparatus shown in FIG. 1 is based on the pattern generating apparatus shown in FIG. 3 and FIG. 1 corresponds to an embodiment in which the pattern generating apparatus of the present invention is applied to the apparatus of FIG. 3. In FIG. 1, numeral 1 denotes an address generator, 2 denotes a control circuit, 3 denotes a memory controller and 4 denotes a test memory. Structural elements in FIG. 1 corresponding to those in FIG. 3 are denoted by the same symbol. However with the modification to the overall construction and operation, the structural elements having these same symbols are also modified into elements having characteristic functions in the present invention. Therefore in the following, the overall construction and operation including that of the structural elements denoted by the same symbols as in FIG. 3 is again described in detail.

The address generator 1 of FIG. 1 generates several patterns for the address pattern "a" comprising a row address and column address for each execution of one transaction, and outputs these to the control circuit 2 and the memory controller 3. After the address generator 1 has generated all of the address patterns for one transaction, it is controlled by a control signal "c" supplied from the control circuit 2 to generate a dummy pattern (to be described later), after which the address pattern of the next transaction is generated. Here the dummy pattern is one wherein neither a row address nor a column address is specified.

The control circuit 2 obtains the time difference between the time required for the address generator 1 to generate all the address patterns for one transaction and the time required for the test memory 4 to complete this one transaction, and outputs to the address generator 1 the control signal "c" for generating a dummy pattern of a quantity corresponding to this time difference.

The control circuit 2 stores the row address for the data (to be described later) housed in a cache of the test memory 4, and then based on this and the address patterns which are sequentially received from the address generator 1, detects the processing time in the test memory 4 corresponding to the sequentially supplied respective address patterns. Furthermore, the time required until the test memory 4 completes the transaction created by generation of the address pattern is also detected by means of this detected processing time.

The memory controller 3 converts the received address pattern "a" into a data pattern corresponding to the protocol transmission system of the test memory 4, and after performing necessary timing adjustment outputs this to the test memory 4 as a request packet "b". Furthermore, the memory controller 3 also stores the row address for the data housed inside the cache of the test memory 4, and detects the processing time in the test memory 4 corresponding to the sequentially supplied respective address patterns, and then carries out the abovementioned timing adjustment based on this. The memory controller 3 does not output the request packet "b" when a dummy pattern is received from the address generator 1.

The test memory 4 is a semiconductor memory incorporating a cache, and is the object of the pass/fail judgement test. This memory is one where it is possible to decode the row address pattern and the column address pattern from the received request packet "b" to thereby access one memory cell specified thereby. If the test memory 4 is one where the data of the memory cell specified by the decoded address pattern is housed inside the cache, the data inside the cache is read at high speed, while if not one where the data is housed inside the cache, the data housed in the internal memory cell array is read out. The processing time corresponding to the respective address patterns in the test memory 4 differs depending on whether or not the data inside the cache is used.

Here the data housed inside the cache of the test memory 4 is updated according to the instruction included in the request packet "b" from the memory controller 3. That is to say, the memory controller 3 can change the data inside the cache depending on the memory cell to be sequentially accessed (specified by the sequential address pattern "a"), and when this instruction is dispatched to the test memory 4, the row address of the data inside the cache which is itself stored therein is also changed depending on the instruction.

Furthermore, of the functions of the memory controller 3 which carries out such change of the data inside the cache, the control circuit 2 also is equipped with a function similar to the function for determining change depending on the memory to be sequentially accessed. In this way, the control circuit 2 detects the change of the data inside the cache by the memory controller 3 based on the sequentially received address pattern "a", and when the data inside the cache is changed, the row address of the data inside the cache which is itself stored therein is also changed depending on the instruction.

In this way, the control circuit 2 and the memory controller 3 each continually determine the operating conditions of the test memory 4.

Next is a description of the operation of the pattern generating apparatus with the construction of the FIG. 1, taking as an example the case where the memory is continually accessed by repeating transactions which sequentially specify four column addresses in the same row address.

Here with the program for executing such operation, the row address and column address are respectively "X", "Y", and the program description for specifying the address of the memory by means of these is "(X, Y)=(row address, column address)". Consequently, with regards to a program description for example where "(X, Y)=(4, 3)", the operation for accessing the memory cells for the row address 4 and the column address 3 is executed. Furthermore, in order to be able to discriminate the start and finish of the respective transactions, letters such as "START" and "END" are respectively attached to the heading of the description specifying the address at the time of starting the transaction and to the heading of the description specifying the address at the time of completion. One example of an actual test pattern program which conforms to such a program description format is shown in FIG. 2. In the following operation description an operation which is carried out by this program is given.

At first, the address generator 1 sequentially generates an address test pattern "a" of "(X, Y)=(4, 0), (4, 1), (4, 2), (4, 3)" in accordance with the row addresses and column addresses sequentially specified during the interval from (1) to (2) in FIG. 2, and supplies this to the control circuit 2 and the memory controller 3.

The memory controller 3 then sequentially receives the address pattern "a", converts this to a data pattern corresponding to the protocol transmission system of the test memory 4, and after carrying out necessary timing adjustment, creates a request packet "b" and outputs this to the test memory 4.

In this way, with the test memory 4, at first the row address and column address are decoded from the received request packet "b" and then one memory cell which is specified by means of these is accessed, and this is done repeatedly. That is to say, if the data of the specified memory cell is housed inside the cache, the data inside the cache is read out, while if not, the data housed in the internal memory cell array is read out.

At this time, the control circuit 2 makes an identity comparison between the row address of the received address pattern "a", and the row address of the data inside the cache doing the storage. In this way it is judged if the processing in the test memory 4, with respect to the address pattern is using the data inside the cache, and based on the judgement result, the processing time (cycle number) in the test memory 4, with respect to the address pattern is detected.

The control circuit 2 thus detects the processing time in the test memory 4 each time the address pattern "a" is sequentially received, and then sequentially totals the detected processing times. Furthermore, the final address pattern (X, Y)=(4, 3) in the currently executed transaction is received, and by means of the total value obtained at the point in time of totalling the processing time, the time required until completion of the transaction is determined.

If the processing time until completion of the transaction, determined by the control circuit 2 is made sixth cycles, the control circuit 2 subtracts from this processing time the time required for generating all the address patterns inside the transaction (four cycles), and obtains a time difference (two cycles) between the time required for generating all the address patterns of the transaction and the time required for the test memory 4 to complete the transaction.

Then based on the obtained time difference, the control circuit 2 outputs to the address generator 1 a control signal "c" for generating a dummy pattern of a two cycle portion for adjusting the time difference. Consequently, the address generator 1 generates the address pattern from between the "START" to "END", and then generates the dummy pattern "(X, Y)=(NOOP, NOOP)" twice.

In this way, the timing for generating the address pattern "a" is automatically adjusted to conform to the operating conditions of the test memory 4, after which the address generator 1 sequentially generates an address pattern "(X, Y)=(4, 4), (4, 5), (4, 6), (4, 7)" for the interval after (3) of FIG. 2, being the following transaction. Moreover, in the same way as above, the memory controller 3 sequentially outputs the request packet "b", so that the memory cell of the test memory 4 is sequentially accessed. Together with this, the control signal "c" which is based on the time difference obtained from the processing time determined by the control circuit 2 is output, and in accordance with this, the address generator 1 generates the dummy pattern "(X, Y)=(NOOP, NOOP)".

Subsequently, by similarly repeating the abovementioned operation, access to the successive memory cells is effected while automatically adjusting the generation timing of the address pattern "a", thereby carrying out pass/fail judgement testing of the test memory 4.

In this way, with the present pattern generating apparatus, the quality judgement test is executed continually while the generation timing of the address pattern is automatically controlled in accordance with the time difference of the operation timing of the address generator 1 and the test memory 4. Moreover, since such generation timing control for the address pattern is carried out for each respective transaction, then if a test pattern is created for several storage region units, the respective storage region units can be accessed in succession and timing adjustment carried out during the respective intervals between the accessing thereof. Furthermore, since the timing adjustment is carried out by automatically generating the dummy pattern, the pattern generating apparatus of FIG. 1 can be constructed using the address generator and the memory controller in the pattern generating apparatus of FIG. 3 wherein the dummy pattern itself is included in the test program.

Here one embodiments of the present invention has been described in detail with reference to the drawings. However the specific construction is not limited to this embodiment, and design modifications etc. which do no deviate from the gist of the invention and which are within the scope of the claims are also included in the present invention.

What is claimed is:

1. A pattern generating apparatus comprising:

address generating means for sequentially generating address patterns for specifying storage regions in a test memory;

first control means for converting said sequentially generated address patterns into a signal transfer configuration for said test memory and supplying these to said test memory to sequentially access said storage regions specified by the respective address patterns, and second control means for determining a condition in which said test memory is operated with respect to the address pattern generated by said address generating means, and controlling a generation timing for said address pattern based on the determined condition.

2. A pattern generating apparatus according to claim 1, wherein the address pattern generated by said address generating means comprises a row address and a column address.

3. A pattern generating apparatus according to claim 1, wherein said address generating means is an address generating means which sequentially generates said address pattern or another pattern which does not specify said storage region, and said second control means controls the generation of said other pattern to thereby control said generation timing.

4. A pattern generating apparatus comprising:

address generating means for sequentially generating address patterns for specifying storage regions in a test memory having a plurality of storage regions with different operating speeds;

first control means for converting said sequentially generated address patterns into a signal transfer configuration for said test memory and supplying these to said test memory to sequentially access said storage regions specified by the respective address patterns, and second controls means for determining a condition in which said test memory is operated with respect to the address pattern generated by said address generating means, and controlling a generation timing for said address pattern based on the determined condition, wherein said second control means determines said condition from the address of the data respectively stored in said plurality of storage regions and said address patterns which are sequentially generated, and wherein said second control means obtains a difference between a first required time required by said generating means to generate addresses and a second required time required to operate said test memory with respect to the generated address pattern, and controls said generation timing in accordance with the difference.

5. A pattern generating apparatus according to claim 4, wherein said test memory has, as said plurality of storage regions, a first storage region capable of high speed readout of data, and a second storage region constituting a normal data storage region.

6. A pattern generating apparatus according to claim 5, wherein said first storage region is a cache memory region, and said second storage region is a memory cell array region.

7. A pattern generating apparatus according to claim 5, wherein said first control means changes the data stored in said first storage region in accordance with said storage region specified by said sequentially generated address patterns.

8. A pattern generating apparatus according to claim 5, wherein said first control means retains the address of data housed in said first storage region, and determines said condition by means of the retained address and said sequentially generated address pattern to thereby adjust the timing for converting and supplying said address pattern.

9. A pattern generating apparatus according to claim 8, wherein said first control means changes the data in said first storage region in accordance with said storage region specified by means of said sequentially generated address pattern.

10. A pattern generating apparatus according to claim 9, wherein when said first control means changes the data in said first storage region, the retained address of data housed in said first storage region is changed in accordance with this change.

11. A pattern generating apparatus according to claim 5, wherein said second control means retains the address of data housed in said first storage region, and determines said condition by means of the retained address and said sequentially generated address pattern.

12. A pattern generating apparatus according to claim 11, wherein said first control means changes the data in said first storage region in accordance with said storage region specified by means of said sequentially generated address pattern, and said second control means changes the retained address of data housed in said first storage region in accordance with said storage region specified by means of said sequentially generated address pattern.

13. A pattern generating apparatus according to claim 4, wherein said second control means obtains said difference each time said address generating means generates a predetermined unit address pattern, and controls said generation timing.

14. A pattern generating apparatus according to claim 13, wherein said second control means obtains said difference and controls said generation timing when said address generating means generates a final address pattern for said predetermined unit address pattern.

15. A pattern generating apparatus according to claim 13, wherein said address generating means is an address generating means which sequentially generates said address pattern or another pattern which does not specify said storage region, and said second control means controls the generation of said other pattern to thereby control said generation timing.

16. A pattern generating apparatus according to claim 4, wherein said address generating means is an address generating means which sequentially generates said address pattern or another pattern which does not specify said storage region, and said second control means controls the generation of said other pattern to thereby control said generation timing.

* * * * *